United States Patent [19]

Kim

[11] Patent Number: 5,812,271
[45] Date of Patent: Sep. 22, 1998

[54] RETICLE PRE-ALIGNMENT APPARATUS AND METHOD THEREOF

[75] Inventor: Sung-wook Kim, Changwon, Rep. of Korea

[73] Assignee: Samsung Aerospace Industries, Ltd., Kyongsangnam-do, Rep. of Korea

[21] Appl. No.: 575,751

[22] Filed: Dec. 20, 1995

[30] Foreign Application Priority Data

Dec. 26, 1994 [KR] Rep. of Korea ................. 1994-36900

[51] Int. Cl.$^6$ .................................................. G01B 11/00
[52] U.S. Cl. ............................................................. 356/401
[58] Field of Search .................................. 356/399–401, 356/375; 250/548, 223 R, 559.3; 414/416, 404, 754, 774, 783, 786, 787, 935, 936, 937, 938, 939, 940, 941

[56] References Cited

U.S. PATENT DOCUMENTS

| | | | |
|---|---|---|---|
| 3,569,718 | 3/1971 | Borner | 250/548 |
| 4,252,442 | 2/1981 | Dandliker et al. | 356/400 |
| 4,878,086 | 10/1989 | Isohata et al. | 356/401 |
| 5,301,013 | 4/1994 | Meijer et al. | 356/375 |

*Primary Examiner*—K. Hantis
*Attorney, Agent, or Firm*—Finnegan, Henderson, Farabow, Garrett & Dunner, L.L.P.

[57] ABSTRACT

A reticle pre-alignment apparatus and method are provided. The apparatus includes a reticle carrier for loading a reticle at a predetermined position on a reticle stage, a light source arranged over the reticle stage for emitting light, an alignment mark formed in the reticle for passing the light, a sensor arranged under the reticle stage for receiving the light passed through the alignment mark to generate a predetermined signal, and a controller for processing the signal from the sensor to drive the reticle carrier, thereby enhancing productivity and simplifying the pre-alignment apparatus and method by increasing speed and accuracy.

11 Claims, 7 Drawing Sheets

RETICLE PRE-ALIGNMENT APPARATUS AND METHOD THEREOF

BACKGROUND OF THE INVENTION

1. Field of the Invention

The present invention relates to a reticle pre-alignment apparatus and method, and more particularly, to a pre-alignment apparatus and method for pre-aligning the reticle at a predetermined position on a reticle stage in an exposure process.

2. Description of Related Art

Generally, a reticle, which is located between a semiconductor chip and a light source, is used as a photo mask, in photolithography for printing a circuit on a semiconductor chip. The reticle, made of glass, requires delicate handling because it can easily be flawed by minute scratches or contamination.

During the exposure process for exposing a reticle image to the surface of an LCD plate or wafer, a loading process is required for loading the reticle onto a reticle stage. Here, it is important to load the reticle precisely at a predetermined position because a position error generated by moving the reticle stage for alignment during the exposure process must be within a correctable range.

Accordingly, it is necessary to minimize the distance between the reticle and the reticle stage during the loading process. The position of a reticle can be adjusted by rotating and moving the reticle in the X-Y direction. However, in minimizing the said distance, careful attention must paid to avoid flawing the reticle by bumping it against the stage.

In a conventional process, an alignment mark formed in the reticle is detected, and a reference mark in the reticle stage is moved under a reticle alignment microscope. To set the position of the microscope, the relative positioning of the microscope is confirmed. Then, by detecting the alignment mark of the reticle through the microscope, pre-alignment and post-alignment are performed.

The above conventional method is limited to the exposure using a single reticle which is disadvantageous in many respects. For instance, in the exposure of a large LCD panel, several different reticles are used, and each reticle must be moved individually to and from the reticle stage in accordance with the above process. Thus, productivity is lowered due to the amount time spent in changing the reticles.

SUMMARY OF THE INVENTION

Accordingly, the present invention is directed to an apparatus and method for reticle pre-alignment that substantially obviates the problems due to limitations and disadvantages of the related art.

The present invention provides a reticle pre-alignment apparatus and method that is capable of enhancing productivity by pre-aligning a plurality of reticles on a reticle stage during the exposure process.

Additional features and advantages of the invention will be set forth in the description which follows, and in part will be apparent from the description, or may be learned by practice of the invention. The objectives and other advantages of the invention will be realized and attained by the apparatus particularly pointed out in the written description and claims hereof as well as the appended drawings.

To achieve these and other advantages and in accordance with the purpose of the invention, as embodied and broadly described, the invention provides a reticle pre-alignment and loading apparatus including a reticle carrier for loading a reticle at a predetermined position on a reticle stage; a light source situated above the reticle stage for illuminating at least one sensor; an alignment mark formed in the reticle for projecting or passing the light; a sensor situated below the reticle stage for receiving the light projecting through the alignment mark to generate a predetermined signal; a processor for processing the signal generated by the sensor to determine whether the difference in position of the reticle from a desired position is within an allowable error range and for generating a position correction signal; and a controller, responsive to the processor, for driving the reticle carrier It is preferred in the present invention that the alignment mark is a cross-shaped pair of elongate passages that cross each other at their midpoints preferably at right angles, and the sensor is a quadrantal sensor consisting of four optical elements.

In another aspect, the invention is a reticle pre-alignment method including the steps of picking up a reticle using a reticle carrier and placing the reticle above and spaced from a reticle stage; irradiating light from a light source to at least one sensor through the at least one alignment mark formed in said spaced reticle; generating a signal according to the amount of light received by the sensor; determining whether the reticle is within or outside of an allowable error range based on the generated signal; loading the reticle onto the reticle stage in response to a determination that the reticle is within the allowable error range; generating a position correction signal for the reticle carrier in response to a determination that the reticle is outside the allowable error range; and correcting the position of the reticle on the reticle carrier according to the position correction signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention and are incorporated in and constitute a part of this specification, illustrate one embodiment of the invention and together with the description serve to explain the principles of the invention. In the drawings.

DETAILED DESCRIPTION OF THE INVENTION

Figure 1:
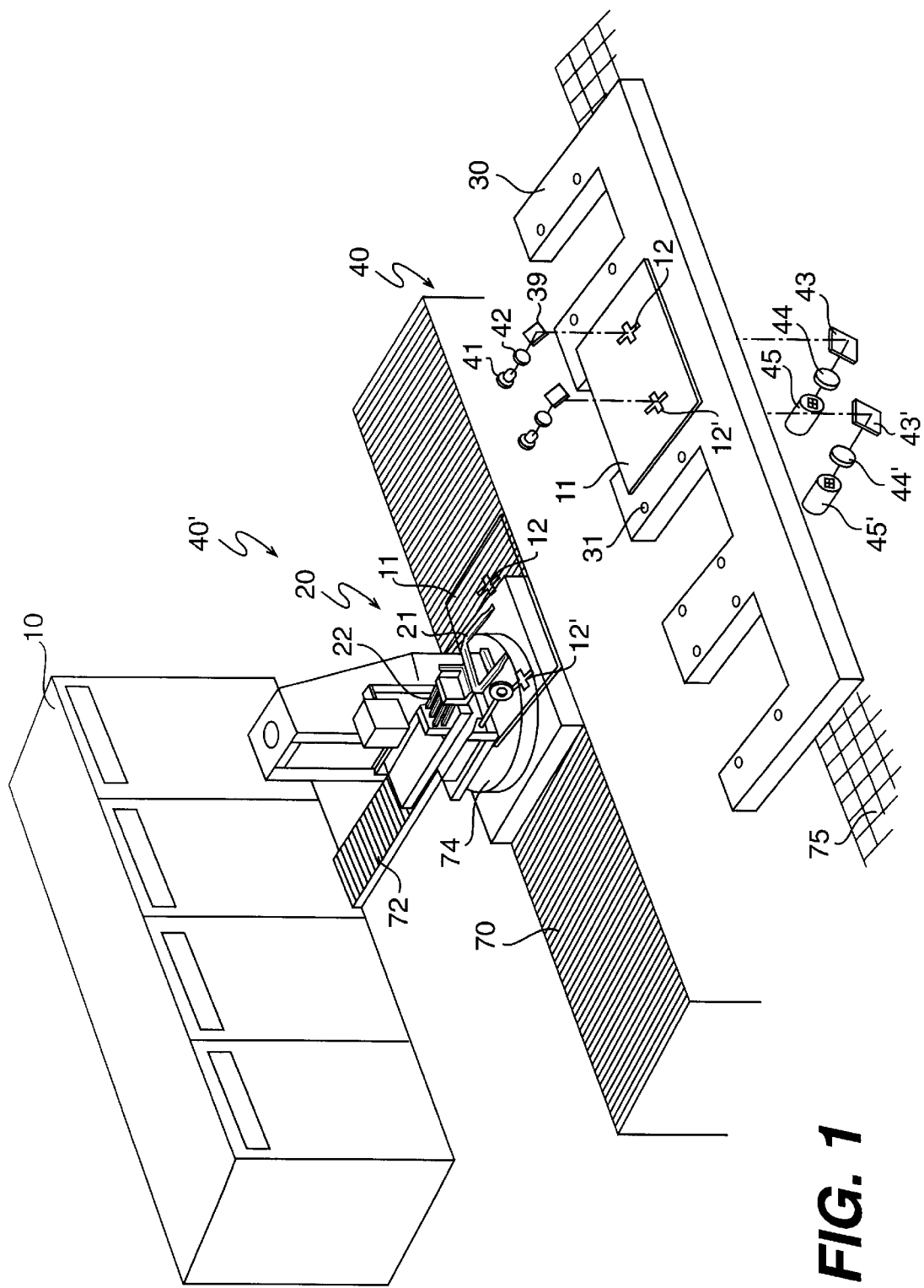
FIG. 1 is a perspective view of a reticle pre-alignment and loading apparatus according to one embodiment of the present invention.

FIG. 1 shows schematically a preferred embodiment of a reticle pre-alignment and loading apparatus 40 according to the present invention. As shown in FIG. 1, a reticle loading portion 40' of the apparatus loads a reticle 11 from a reticle cabinet 10 at a predetermined position on a reticle stage 30 by using a fork 21 of a reticle carrier 20.

Reticle pre-alignment and loading apparatus 40 pre-aligns reticle 11 at a predetermined position on reticle stage 30 when the reticle loading portion of the apparatus loads reticle 11 on reticle stage 30. The relative position of reticle 11 placed on reticle stage 30 must be within a correctable range for subsequent precise-alignment of the reticle.

Referring to FIG. 1, reticle pre-alignment and loading apparatus 40 includes a light source 41, an alignment mark 12 formed in the reticle to project light from light source 41, and a sensor 45 for receiving the light which projects or in other words passes through alignment mark 12 from light source 41.

Figure 2:
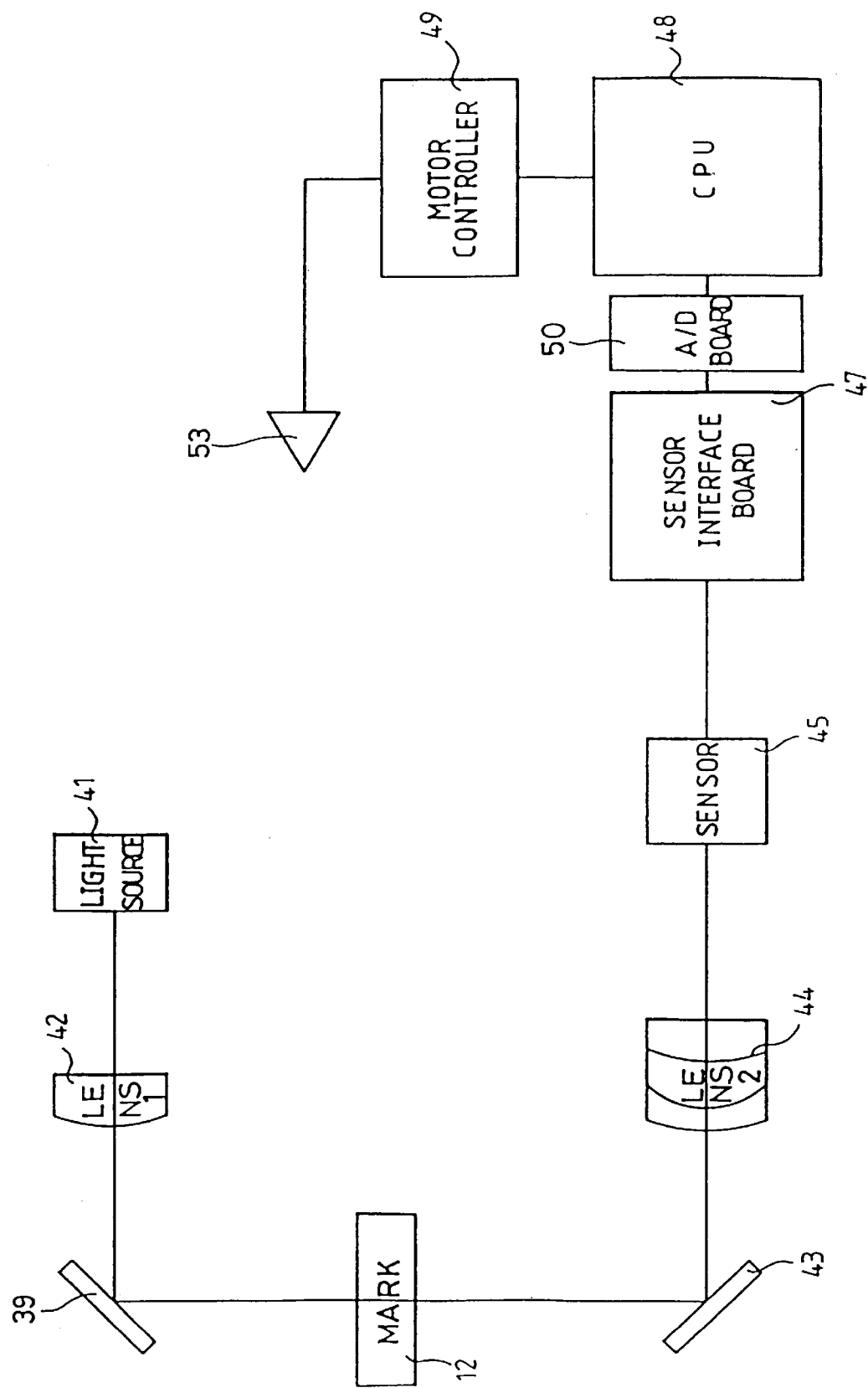
FIG. 2 is a schematic block diagram of major portions of the reticle pre-alignment and loading apparatus of FIG. 1.

As shown in FIGS. 1 and 2, the present invention provides a first lens 42 for concentrating the light at a predetermined position on a mirror 39 for changing the light path. Lens 42 and mirror 39 are both located between light source 41 and alignment mark 12. A second lens 44 and a reflecting mirror 43 for receiving the light passing through alignment mark 12 are both located between alignment mark 12 and a sensor 45.

A sensor interface board 47, a CPU 48 and a motor controller 49 are connected to sensor 45, to provide a carrier driving control signal 53 for driving the reticle loading apparatus by processing the signal detected by sensor 45. As previously mentioned, alignment mark 12 is preferably a cross-shaped pair of elongate passages that cross each other at their midpoints preferably at right angles.

Figure 3B:
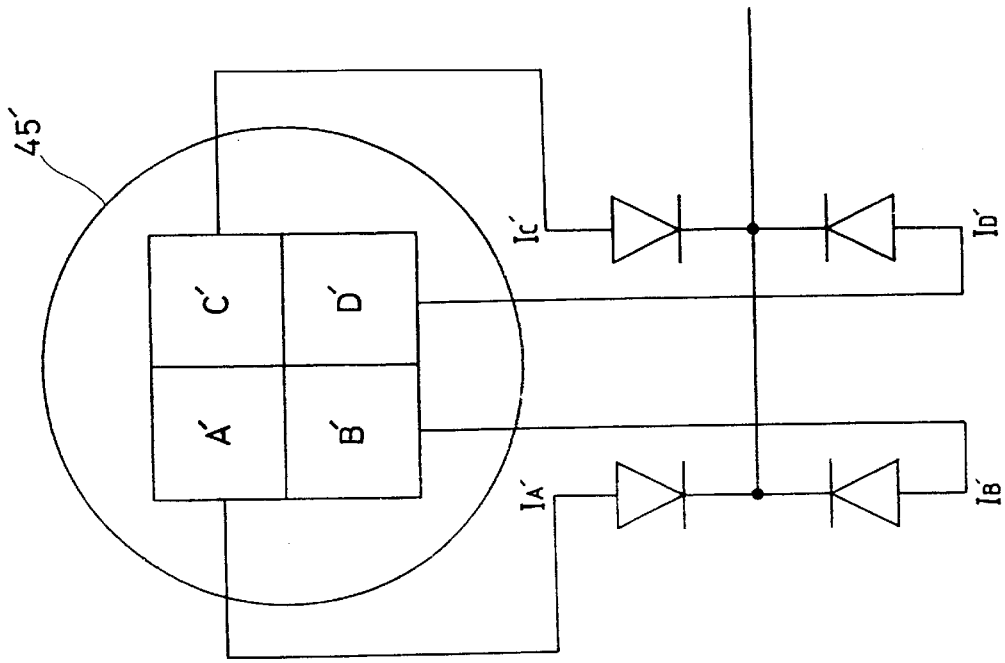
FIGS. 3A and 3B are schematic circuit diagrams of a pair of sensors, each sensor made up of four optical elements.
Figure 3A:
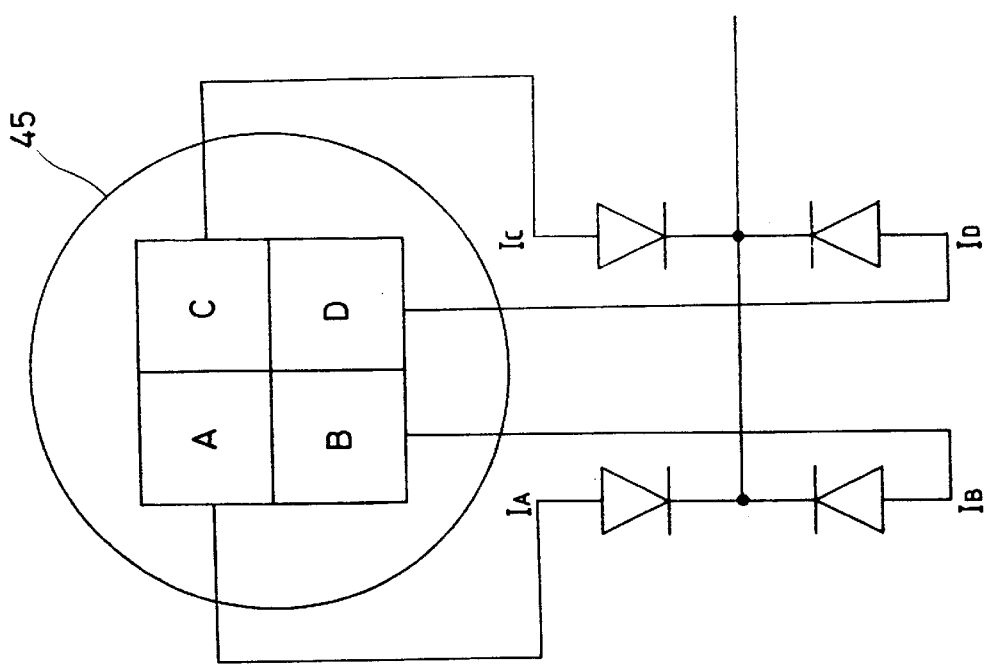

As shown in FIG. 3A, sensor 45 is a quadrantal sensor, or in other words a sensor which consists of four optical elements, A, B, C, and D, located in respective quadrants of the X, Y coordinates of the sensor. Each sensor 45 and 45' of FIG. 3A and 3B generates current in proportion to the amount of light received by each optical element, A, B, C, and D, and A', B', C' and D' respectively, through two alignment marks 12 and 12' formed in reticle 11.

Figure 4:
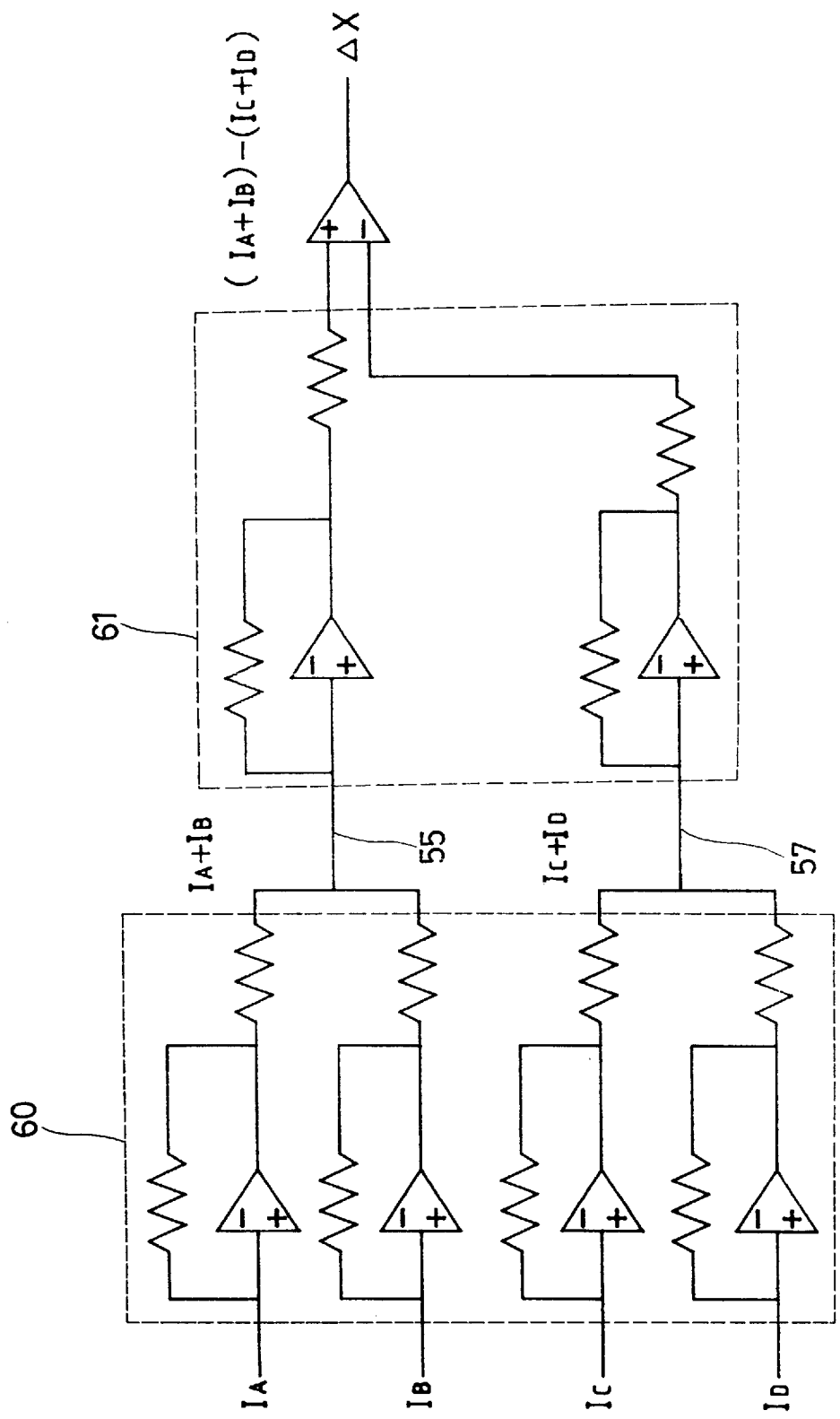
FIG. 4 is a schematic circuit diagram for processing a reticle pre-alignment signal (ΔX) according to the present invention.

FIG. 4 is a circuit diagram for processing the reticle pre-alignment signal. The amount of current generated by each of the optical element is converted from current to a corresponding voltage value by voltage converters 60 which are located on sensor interface board 47. The amount of current I generated by each of the optical element A, B, C, and D of sensor 45 and A', B', C', and D' of sensor 45' are summed. Particularly, optical elements A and B in the −X, Y coordinate quadrant and the X, Y coordinate quadrant, respectively, are summed to obtain a voltage value at output line 55. The optical elements C and D in the −X, −Y, and the X, −Y coordinate quadrants are summed to produce a voltage value at output line 57.

The voltage values are amplified by amplifier 61. The total amplified voltage value of elements A and C are subtracted from the sum of the voltage values B and D by device 62 to obtain the signal ΔX. The converted voltage value ΔX is transmitted to an analog-to-digital (A/D) converting board 50 of FIG. 2. Then, after voltage amplification for signal processing, the signal transmitted to A/D converting board 50 is converted into a digital form and transmitted to CPU 48 of FIG. 2 for processing. CPU 48 processes the transmitted value by an algorithm and uses the calculated result to compute the movement of the reticle outside the allowable error range.

The formula for calculating the amount of displacement of a reticle, configured in the hardware within a sensor interface board 47 of FIG. 2, for moving the reticle in the X- and Y-axis directions depending on the current values of each optical element can be shown as follows:

$$\Delta X = (I_A + I_B) - (I_C + I_D)$$
$$\Delta Y_1 = (I_A + I_C) - (I_B + I_D)$$
$$\Delta Y_2 = (I_{A'} + I_{C'}) - (I_{B'} + I_{D'})$$

Here, $I_A$ to $I_D$ correspond to the output amount (current) of optical elements A to D of first sensor 45, shown in FIG. 3A, and $I_{A'}$ to $I_{D'}$ correspond to output amount (current) of optical elements A' to D' of second sensor 45', shown in FIG. 3B.

Figure 5A:
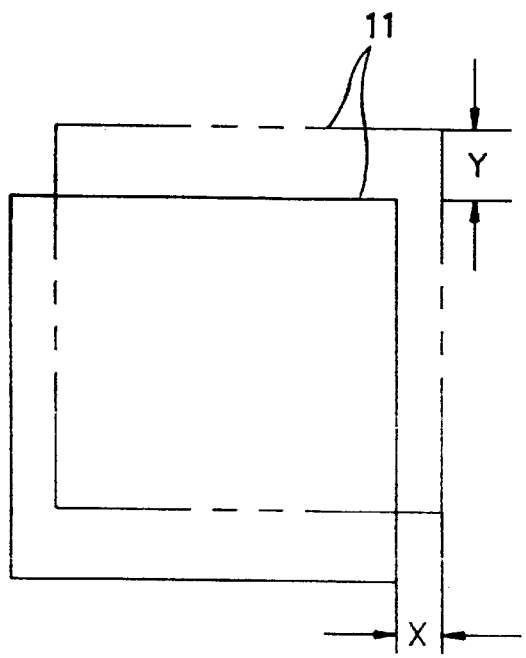
FIGS. 5A, 5B and 6A–6C are diagrams illustrating reticle displacements of the reticle pre-alignment apparatus and method of the present invention.
Figure 6A:
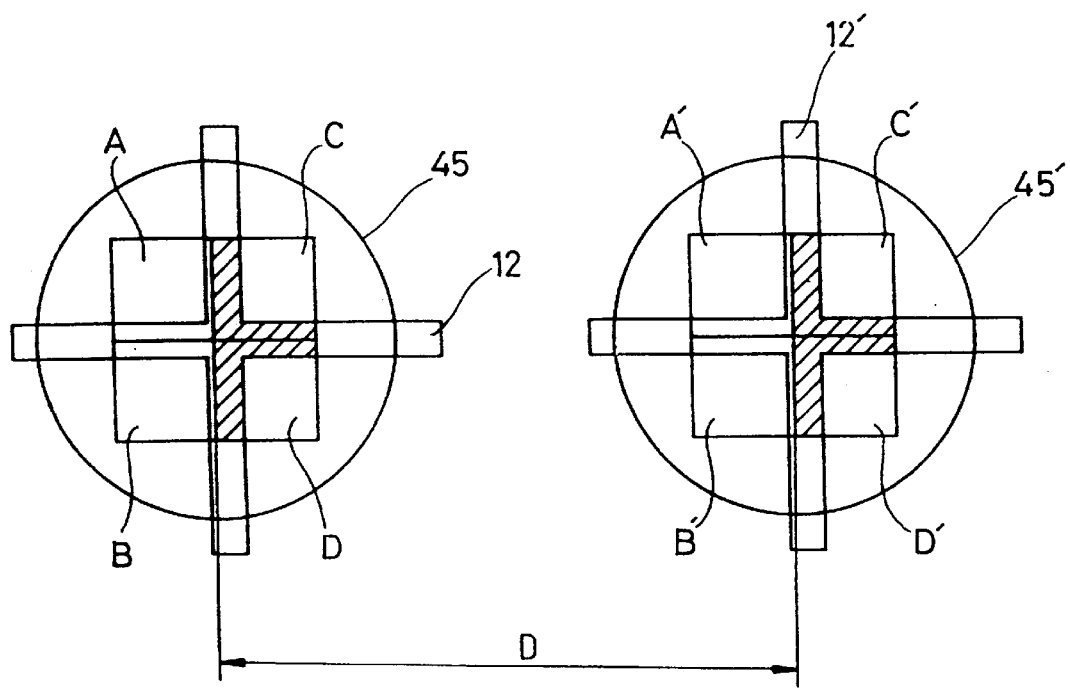

Referring to FIGS. 5A and 6A, when there is an X direction error and no Y direction error, which means reticle 11 is moved beyond the allowable error range only in the X direction, $\Delta Y_1$ and $\Delta Y_2$ each are zero. The ΔX value is transmitted to CPU 48 and converted therein to an appropriate pulse signal for transmission to motor controller 49. Hence, X-axis driving portion 70 of carrier 20 or an X-Y axes driving portion 75 of reticle stage 30 (shown in FIG. 1) is operated.

Figure 6B:
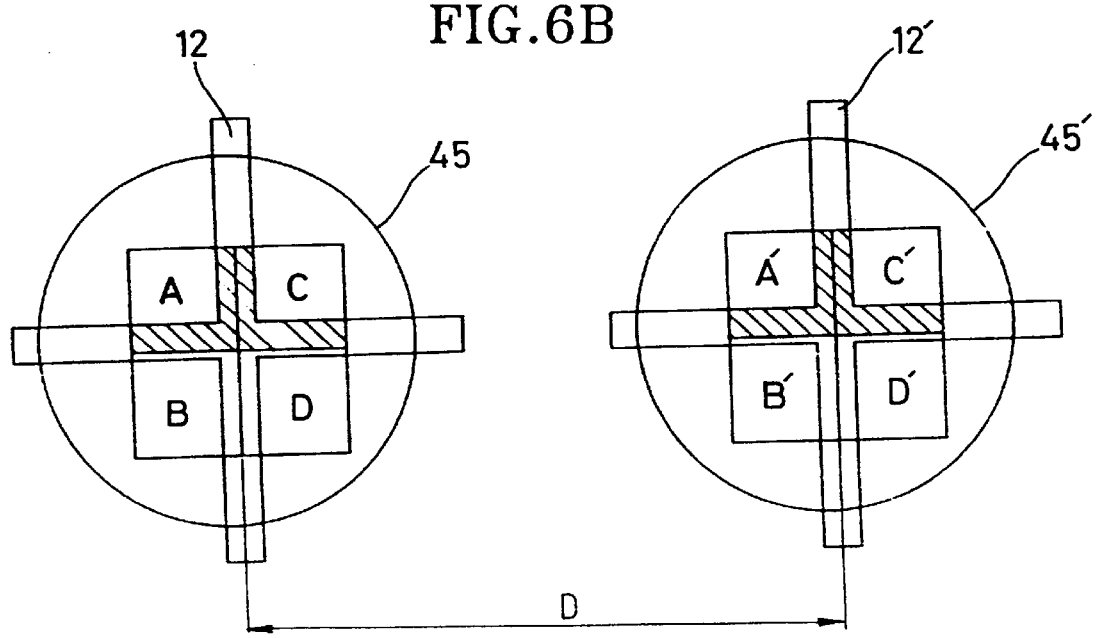

Referring to FIGS. 5A and 6B, when there is Y direction error and no X direction error, which means reticle 11 is beyond the allowable error range only in the Y direction, ΔX is zero while $\Delta Y_1$, and $\Delta Y_2$ are of equal value other than zero. The $\Delta Y_1$ and $\Delta Y_2$ value, are transmitted to CPU 48 and converted therein to an appropriate pulse signal for transmission to motor controller 49, hence, Y-axis driving portion 72 of carrier 20 or X-Y axes driving portion 75 of reticle stage 30 is operated.

Figure 5B:
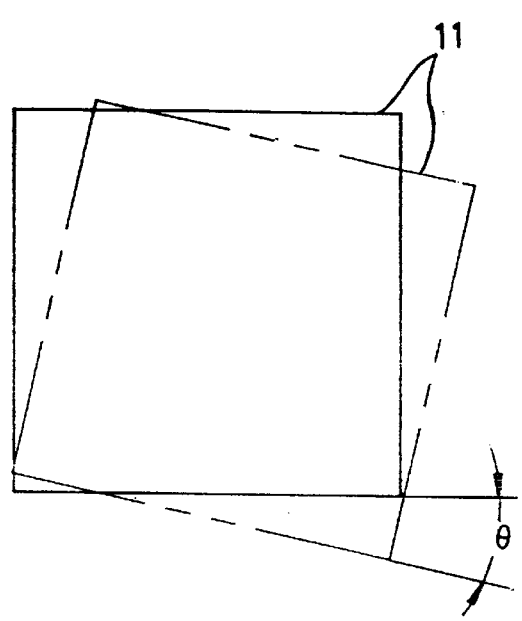
Figure 6C:
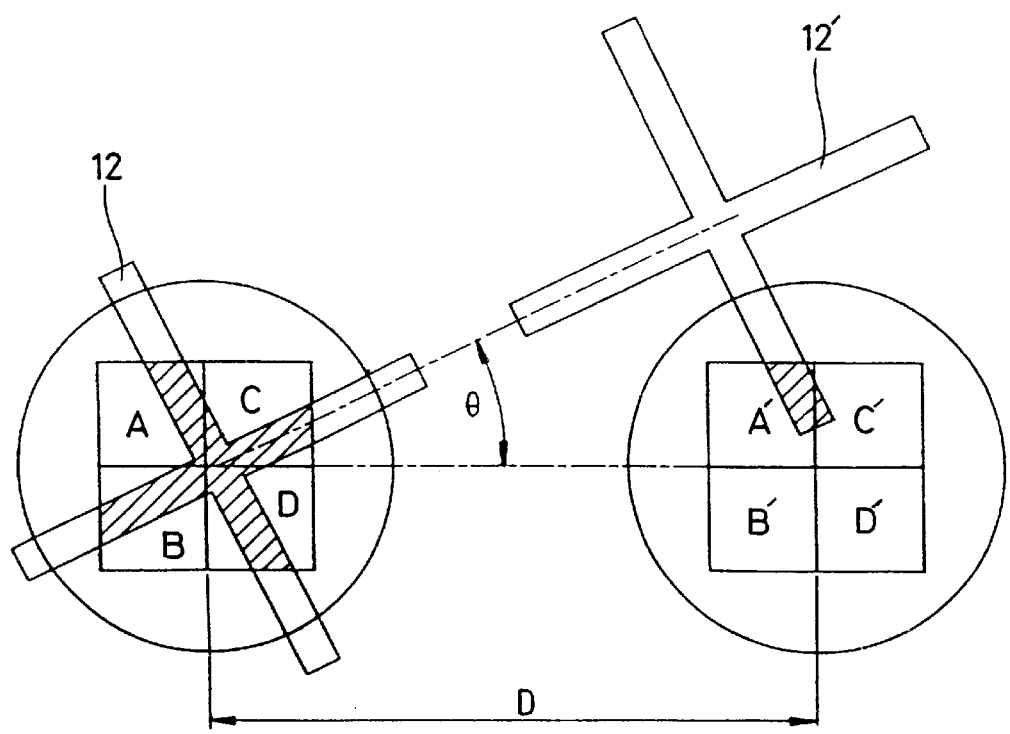

Referring to FIGS. 5B and 6C, when a reticle 11 rotates at an angle of θ, the ΔX, $\Delta Y_1$ and $\Delta Y_2$ values are all transmitted to CPU 48. Here, angle θ can be calculated according to $\theta = \tan^{-1}[(Y_2 - Y_1)/D]$, where D represents the distance between the central lines of the two sensors. Then, the calculated result is converted to an appropriate pulse by CPU 48 and transmitted to motor controller 49. Hence, θ-axis driving portion 74 of carrier 20 is operated.

Hereinafter, the operation of reticle pre-alignment and loading apparatus 40 and the steps of the method are explained referring to FIGS. 1 and 2.

Fork 21 of reticle carrier 20 descends, leaving only a minute gap for pre-alignment of reticle 11 on reticle stage 30. Here, compressed air is discharged through air hole 31 provided in reticle stage 30. A fourfold link 22 is installed between fork 21 and the body of carrier 20, so that reticle 11 can be kept parallel to stage 30. Thus, it avoids bumping of reticle 11 against stage 30 and prevents flawing of reticle 11.

The pre-alignment of reticle 11 is achieved while fork 21 of carrier 20, which carries reticle 11, is spaced from stage 30. In other words, the light emitted from light source 41 installed over reticle stage 30 is concentrated while passing through first lens 42 and irradiates pre-alignment mark 12 formed in reticle 11. The light projecting through alignment mark 12 is reflected by reflection mirror 43 and is directed to sensor 45 via second lens 44.

The signal generated by sensor 45, based on the amount of light, is transmitted to CPU 48 via sensor interface 47 to determine whether the shifting of reticle 11 is within allowable error range. CPU 48 transmits the signal via motor controller 48 to X-, Y- and θ-driving portions, 70, 72, and 74, respectively, of reticle carrier 20 or X-Y axes driving portion 75 of reticle stage 30 (shown in FIG. 1), to move the X, Y and θ axes of reticle carrier 20 or X-Y axes driving portion 75 of reticle stage 30 so as to locate reticle 11 within the allowable error range. If reticle 11 on carrier 20 is outside the allowable error range, CPU 48 receives the signal again from sensor 45' to determine whether the reticle is within the allowable error range.

In the pre-alignment process, when the movement state of reticle 11 is within the programmed allowable error range of CPU 48, the valve (not shown) for the compressed air, which discharges through air hole 31 of stage 30, is closed and a vacuum valve (not shown) of carrier 20 is opened so that reticle 11 is held onto stage 30 via suction. The vacuum valve is then closed, thus completing the loading of pre-aligned reticle 11 from fork 21 of reticle carrier 20 onto reticle stage 30.

Figure 7:
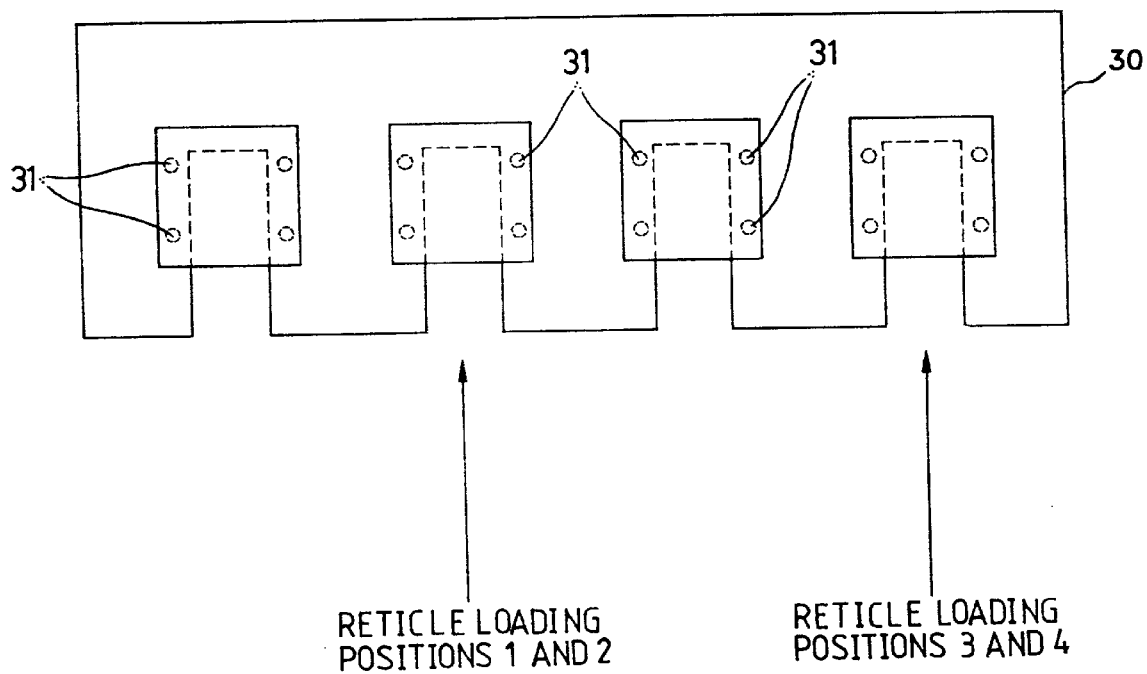
FIG. 7 is a plan view illustrating the loading positions of the reticle by a carrier of the reticle pre-alignment and loading apparatus according to the present invention.

FIG. 7 shows positions of the reticle loaded by the carrier of the reticle pre-alignment and loading apparatus 40 according to the present invention. As shown in FIG. 7, two loading positions where the reticles are pre-aligned by carrier 20 are set.

Two loading locations are necessary because loading at a single position increases the length of the reticle stage stroke, which slows the operation. For example, when two loading positions (rather than one single loading position) are provided, the time needed to load the reticles can be reduced by half when compared to the time needed when only the single loading position is provided. Since the reticle can be loaded in any one of the two loading locations, each of reticle stage 30 and reticle loading portion 40' needs to be moved only half the distance needed when the single loading position is provided.

When the pre-alignment process for loading the reticle at a predetermined position on reticle stage 30 is completed, the reticle stage is moved for post-alignment. After the post-alignment, an exposure process begins.

As described above, the reticle pre-alignment apparatus and method according to the present invention can load and expose a plurality of reticles sequentially, thereby enhancing productivity and simplifying the pre-alignment apparatus and method by increasing speed and accuracy.

What is claimed is:

1. A reticle pre-alignment and loading apparatus comprising:

a reticle carrier for placing a reticle above and spaced from a reticle stage;

a light source situated above the reticle stage for illuminating at least one sensor situated below the reticle stage;

at least one alignment mark formed in the reticle for passing light from the light source to the at least one sensor, which generates a signal in response to the passed light;

a processor for processing the signal generated by the at least one sensor to determine whether the difference in position of the reticle from a desired position is within an allowable error range and for generating a position correction signal; and a controller, responsive to the position correction signal, for driving said reticle carrier.

2. The reticle pre-alignment and loading apparatus of claim 1, wherein said at least one alignment mark comprises first and second spaced alignment marks, each said alignment mark including a pair of crossed elongated passages defining X- and Y-axis.

3. The reticle pre-alignment and loading apparatus of claim 1, wherein the at least one sensor includes first and second sensors each having four optical elements, A, B, C, and D and A', B', C', and D' respectively, with said four optical elements located in an −X, Y coordinate quadrant, X, Y coordinate quadrant, −X, −Y coordinate quadrant, and X, −Y coordinate quadrant, respectively.

4. A reticle pre-alignment and loading apparatus described in claim 3, wherein the controller comprises:

means responsive to a first signal generated by the first sensor for generating a driving signal having a value $\Delta X$ corresponding to a displacement of the reticle along the X-axis;

means responsive to a second signal generated by the first sensor for generating a driving signal having a value $\Delta Y_1$ corresponding to a displacement of the reticle along the Y-axis; and means responsive to a third signal generated by the first and second sensors for generating a driving signal having a value $\Delta Y_2$ corresponding to an angular displacement of the reticle relative to both the X- and Y-axis.

5. A reticle pre-alignment and loading apparatus described in claim 4, wherein $\Delta X=(I_A+I_B)-(I_C+I_D)$, $\Delta Y_1=(I_A+I_C)-(I_B+I_D)$, and $\Delta Y_2=(I_{A'}+I_{C'})-(I_{B'}+I_{D'})$, where $I_A$ $I_B$ $I_C$ and $I_D$ and $I_{A'}$ $I_{B'}$ $I_{C'}$ and $I_{D'}$ represent current in proportion to the amount of light received by said corresponding optical elements through said alignment mark.

6. A reticle pre-alignment and loading method comprising the steps of:

(a) picking up a reticle using a reticle carrier and placing the reticle above and spaced from a reticle stage;

(b) irradiating light from a light source situated above the reticle stage to at least one sensor situated below the reticle stage through at least one alignment mark formed in said reticle;

(c) generating a signal according to the amount of light received by the at least one sensor;

(d) determining whether the reticle is within or outside of an allowable error range based on the generated signal;

(e) loading the reticle onto the reticle stage in response to a determination that the reticle is within the allowable error range;

(f) generating a position correction signal for the reticle carrier in response to a determination that the reticle is outside the allowable error range; and (g) correcting the position of the reticle on the reticle carrier according to the position correction signal.

7. The reticle pre-alignment and loading method of claim 6, wherein the step of irradiating the light, comprises irradiating the light through the at least one alignment mark having a pair of crossed elongate passages.

8. The reticle pre-alignment and loading method of claim 6, wherein the step of generating a signal according to the amount of light received by the at least one sensor comprises:

generating the signal in accordance with the amount of light received by each of four optical elements dividing the at least one sensor into upper left −X, Y, upper right, X, Y, lower left, −X, −Y, and lower right, X, −Y quadrants, said quadrants defining an X-and Y-axis.

9. The reticle pre-alignment and loading method of claim 8, wherein the step of determining whether the reticle is within or outside an allowable error range comprises:

determining a displacement value $\Delta X$ of the reticle along the X-axis;

determining a displacement value $\Delta Y_1$ of the reticle along the Y-axis; and determining a displacement value $\Delta Y_2$ of the reticle angularly relative to the X- and Y-axis.

10. The pre-alignment and loading method of claim 9, wherein, $\Delta X = (I_A+I_B)-(I_C+I_D)$, $\Delta Y_1 = (I_A+I_C)-(I_B+I_D)$, and $\Delta Y_2 = (I_{A'}+I_{C'})-(I_{B'}+I_{D'})$, where $I_A$ $I_B$ $I_C$ and $I_D$ and $I_{A'}$ $I_{B'}$ $I_{C'}$ and $I_{D'}$ represent current in proportion to the amount of light received by each said corresponding optical element through said alignment mark, and transmitting $\Delta X$, $\Delta Y_1$, and $\Delta Y_2$ to a CPU to perform said steps (e), (f), and (g) of claim 6.

11. The reticle pre-alignment and loading method of claim 9, wherein the step of determining the displacement value of $\Delta Y_2$ comprises determining the value of a rotation angle $\theta$ according to the formula $\theta = \tan^{-1}[(\Delta Y_2 - \Delta Y_1)/D$ where D represents the distance between a first and a second sensor.

* * * * *